United States Patent
Pandey et al.

(10) Patent No.: US 12,009,412 B2
(45) Date of Patent: Jun. 11, 2024

(54) BIPOLAR TRANSISTORS

(71) Applicant: GLOBALFOUNDRIES U.S. Inc., Malta, NY (US)

(72) Inventors: Shesh Mani Pandey, Saratoga Springs, NY (US); Judson R. Holt, Ballston Lake, NY (US); Vibhor Jain, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/549,013

(22) Filed: Dec. 13, 2021

(65) Prior Publication Data
US 2023/0087058 A1    Mar. 23, 2023

Related U.S. Application Data

(60) Provisional application No. 63/246,463, filed on Sep. 21, 2021.

(51) Int. Cl.
*H01L 29/732* (2006.01)
*H01L 29/66* (2006.01)

(52) U.S. Cl.
CPC ...... *H01L 29/732* (2013.01); *H01L 29/66234* (2013.01)

(58) Field of Classification Search
None
See application file for complete search history.

(56) References Cited

U.S. PATENT DOCUMENTS

| | | | |
|---|---|---|---|
| 5,702,958 A * | 12/1997 | Liu | H01L 29/7371 257/E29.189 |
| 7,763,518 B2 | 7/2010 | Ho et al. | |
| 8,809,957 B2 | 8/2014 | Bangsaruntip et al. | |
| 2010/0032804 A1* | 2/2010 | Balster | H01L 29/7378 257/E29.174 |
| 2015/0270335 A1 | 9/2015 | Sadovnikov et al. | |
| 2016/0049503 A1* | 2/2016 | Camillo-Castillo | H01L 21/8249 257/51 |
| 2019/0386121 A1* | 12/2019 | Goktepeli | H01L 29/7371 |
| 2020/0006520 A1* | 1/2020 | Ban | H01L 29/41708 |
| 2021/0091180 A1 | 3/2021 | Pekarik et al. | |

FOREIGN PATENT DOCUMENTS

KR    100960691    9/2009

OTHER PUBLICATIONS

Thibeault et al., "A Study of Ultra-High Performance SiGe HBT Devices on SOI", IEEE BCTM 13.4, 2013, 4 pages.

* cited by examiner

*Primary Examiner* — Xiaoming Liu
(74) *Attorney, Agent, or Firm* — Francois Pagette; Andrew M. Calderon; Calderon Safran & Wright, PC

(57) ABSTRACT

The present disclosure relates to semiconductor structures and, more particularly, to bipolar transistors and methods of manufacture. The structure includes: a base region composed of a semiconductor on insulator material; an emitter region above the base region; and a collector region under the base region and within a cavity of a buried insulator layer.

20 Claims, 5 Drawing Sheets

BIPOLAR TRANSISTORS

BACKGROUND

The present disclosure relates to semiconductor structures and, more particularly, to bipolar transistors and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: a base region comprising a semiconductor on insulator material; an emitter region above the base region; and a collector region under the base region and within a cavity of a buried insulator layer.

In an aspect of the disclosure, a structure comprises: a semiconductor on insulator substrate comprising a semiconductor handle substrate, a buried insulator material above the semiconductor handle substrate and a semiconductor layer above the buried insulator material; a base region comprising the semiconductor layer and bounded by shallow trench isolation structures; an emitter region vertically above the base region; and a collector region vertically below the base region and surrounded by the buried insulator material.

In an aspect of the disclosure, a method comprises: forming a base region comprising a semiconductor on insulator material; forming an emitter region above the base region; and forming a collector region under the base region and within a cavity of a buried insulator layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to bipolar transistors and methods of manufacture. More specifically, the present disclosure relates to high performance vertical bipolar transistors in semiconductor on insulator (SOI) technology. Advantageously, the bipolar transistors provide for high voltage RF device applications (e.g., low noise amplifiers and power amplifiers), with the SOI technology providing additional benefits of reduced capacitance and noise isolation.

In more specific embodiments, the bipolar transistors include an ultra-narrow base (Wb) comprising a SiGe core. The SiGe core may be a top semiconductor layer of the SOI technology, with a collector region embedded in a buried insulator material of the SOI technology. The base region may be tunable by providing a graded Ge profile, dopant profile and/or adjusting the width, depending on design parameters of the bipolar transistor. In embodiments, the width of the SiGe core may be between 1 nm to 20 nm; although other dimensions are also contemplated herein depending on desired device performance and specific application. The buried insulator layer may be a buried oxide material (BOX) of the SOI technology which surrounds the collector region. The SiGe core (base) and collector region may also be above an airgap in the buried insulator material.

The bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the bipolar transistors of the present disclosure have been adopted from integrated circuit (IC) technology. For example, the structures are built on wafers and are realized in films of material patterned by photolithographic processes on the top of a wafer. In particular, the fabrication of the bipolar transistors uses three basic building blocks: (i) deposition of thin films of material on a substrate, (ii) applying a patterned mask on top of the films by photolithographic imaging, and (iii) etching the films selectively to the mask. In addition, as is known in the art, precleaning processes may be used to clean etched surfaces of any contaminants, as is known in the art. Moreover, when necessary, a rapid thermal anneal processes may be used to drive-in dopants or material layers as is known in the art.

Figure 1:
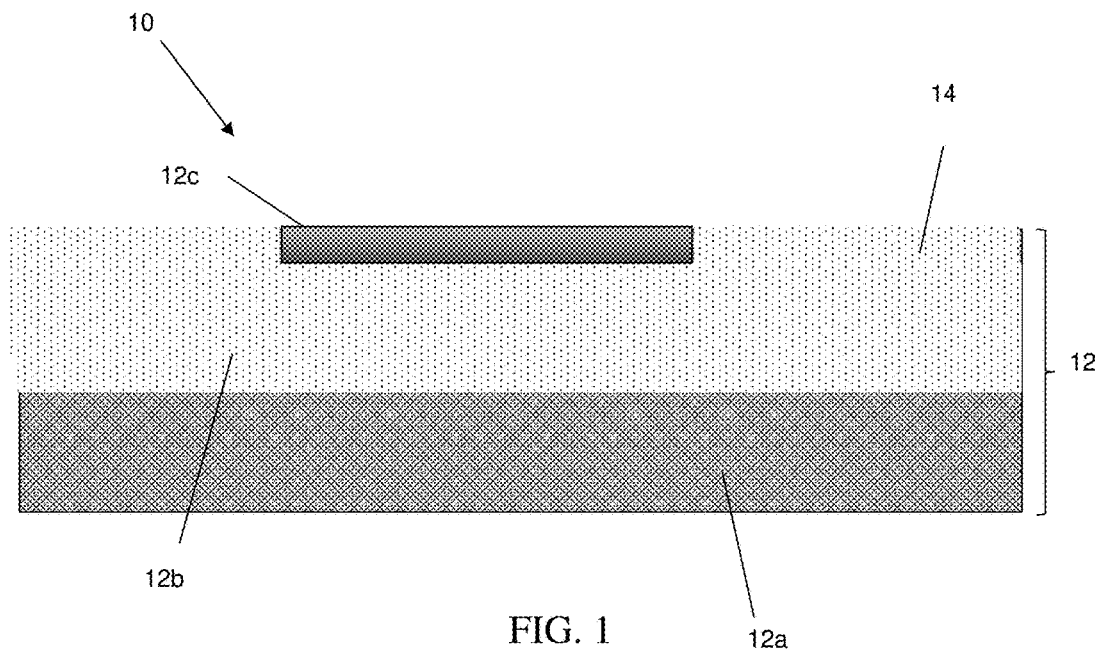
FIG. 1 shows a starting substrate, amongst other features, and respective fabrication processes in accordance with aspects of the present disclosure.

FIG. 1 shows a starting substrate in accordance with aspects of the present disclosure. In particular, the structure 10 of FIG. 1 includes a substrate 12 comprising a semiconductor-on-insulator (SOI) substrate. The semiconductor-on-insulator (SOI) substrate 12 includes a semiconductor handle wafer 12a, an insulator layer 12b and a semiconductor layer 12c on the insulator layer 12b. The semiconductor handle wafer 12a provides mechanical support to the insulator layer 12b and the semiconductor layer 12c. The semiconductor layer 12c may be formed by a deposition process, such as chemical vapor deposition (CVD) or plasma enhanced CVD (PECVD). Alternatively, the semiconductor layer 12c may be formed using a smart cut process where two semiconductor wafers are bonded together with an insulator material between the two semiconductor wafers.

In the SOI implementation, the semiconductor handle wafer 12a may be composed of any suitable semiconductor material including, but not limited to, Si, SiGe, SiGeC, SiC, GaAs, InAs, InP, and other III/V or II/VI compound semiconductors. The semiconductor layer 12c may preferably be SiGe material, used as a base region of a bipolar transistor. The semiconductor layer 12c may have a graded percentage of Ge material ranging from, e.g., 50% at the bottom to 0% at the top as an example; although other percentages are also contemplated herein. In alternative embodiments, the semiconductor layer 12c may be Si material.

The width of the semiconductor layer 12c may be tunable depending on desired device performance and specific application. For example, the semiconductor layer 12c may be thinned using a conventional oxidation process followed by an etching process to remove the oxidized portion of the semiconductor layer 12c. The semiconductor layer 12c may be thinned to about 1 nm to about 20 nm; although other dimensions are also contemplated herein.

The semiconductor layer 12c may also be lightly doped with a p-type dopant, e.g., boron. In embodiments, the semiconductor layer 12c may be doped by introducing a dopant by, for example, ion implantation that introduces a concentration of a dopant in the semiconductor layer 12c. In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The dopant can be driven in by a rapid thermal anneal process.

Still referring to FIG. 1, the insulator layer 12b may include a dielectric material such as silicon dioxide, silicon nitride, silicon oxynitride, boron nitride or a combination thereof. In a preferred embodiment, the insulator layer 12b may be a buried oxide layer (BOX). The insulator layer 12b may be formed by a deposition process, such as CVD, PECVD or physical vapor deposition (PVD). In further embodiments, the insulator layer 12b may be formed using a thermal growth process, such as thermal oxidation, to convert a surface portion of the semiconductor handle wafer 12a to an oxide material, e.g., insulator layer 12b. In yet another embodiment, the insulator layer 12b can be formed by implanting oxygen atoms into a bulk semiconductor substrate and thereafter annealing the structure.

Referring still to FIG. 1, shallow trench isolation structures 14 are formed within the semiconductor layer 12c, extending to the insulator layer 12b. The shallow trench isolation structures can be used to define the base region, e.g., the semiconductor layer 12c between the shallow trench isolation structures 14.

The shallow trench isolation structures 14 can be formed by conventional lithography, etching and deposition methods known to those of skill in the art. For example, a resist formed over the semiconductor layer 12c is exposed to energy (light) to form a pattern (opening). An etching process with a selective chemistry, e.g., reactive ion etching (RIE), will be used to form one or more trenches in the semiconductor layer 12c through the openings of the resist. Following the resist removal by a conventional oxygen ashing process or other known stripants, insulator material (e.g., SiO2) can be deposited within the trenches by any conventional deposition process, e.g., chemical vapor deposition (CVD) processes. Any residual insulator material on the surface of the semiconductor layer 12c may be removed by conventional chemical mechanical polishing (CMP) processes.

Figure 2:
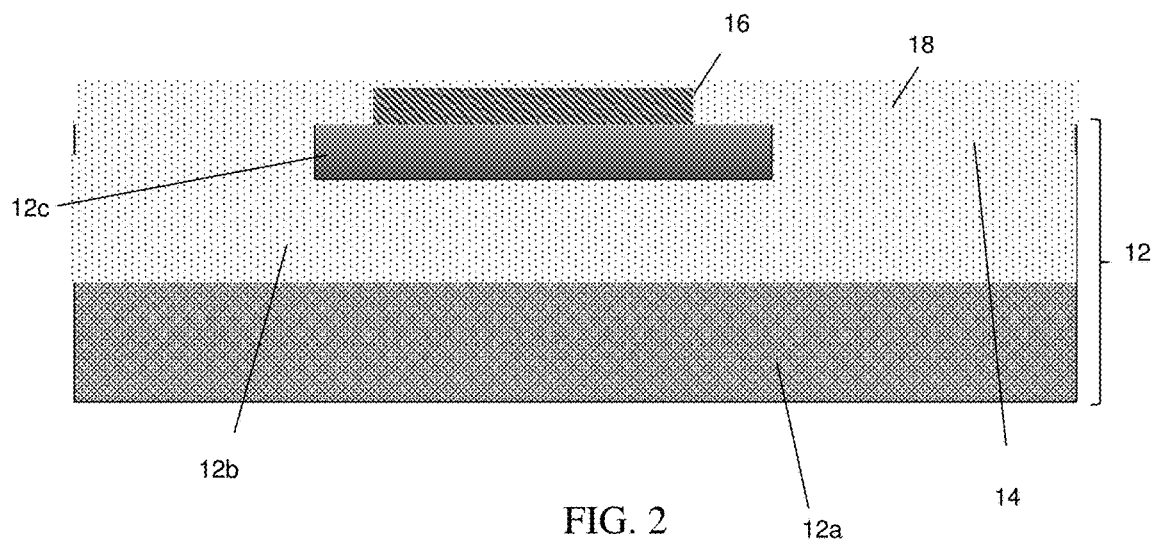
FIG. 2 shows an emitter region on the substrate, amongst other features, and respective fabrication processes in accordance with aspects of the present disclosure.

In FIG. 2, an emitter material 16 is partially formed over the semiconductor layer 12c, e.g., collector region. In embodiments, the emitter material 16 may be Si material. In more specific embodiments, the emitter material 16 may be N+ doped Si material. The emitter material 16 may also be polysilicon material. The emitter material 16 may be formed vertically above and in contact with the semiconductor layer 12c.

The emitter material 16 may be formed by forming (e.g., depositing) insulator material 18 over the semiconductor layer 12c and shallow trench isolation structures 14, followed by a lithography and etching process to form an opening exposing the semiconductor layer 12c. The insulator material 18 may be an oxide material, deposited by a CVD process. The emitter material 16 may be deposited within the opening of the insulator material 18 using an epitaxial growth process as is known in the art such that no further explanation is required for a complete understanding of the present disclosure. The epitaxial growth process may also include an in-situ doping process of n-type dopants, e.g., arsenic, etc. In alternative embodiments, the emitter material 16 may be fully formed over the semiconductor layer 12c by deposition and patterning processes.

Figure 3:
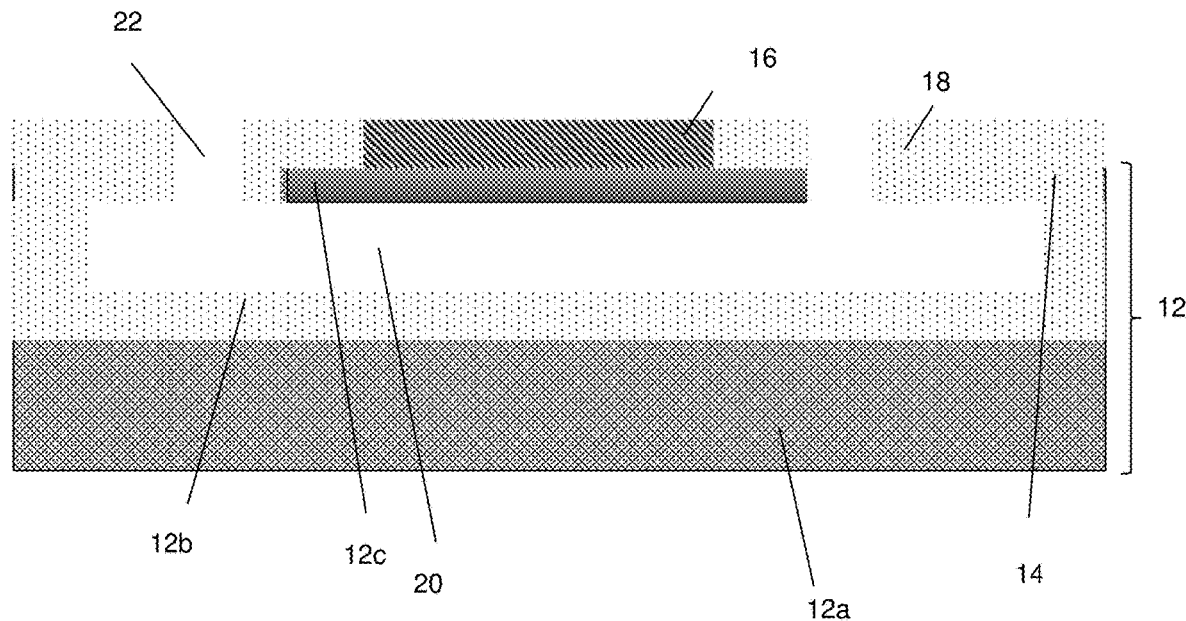
FIG. 3 shows a cavity in a buried insulator layer, under the partial emitter region, amongst other features, and respective fabrication processes in accordance with aspects of the present disclosure.

FIG. 3 shows a cavity 20 formed in the insulator layer 12b, under the semiconductor layer 12c. In embodiments, the cavity 20 may expose an underside of the semiconductor layer 12c. The cavity 20 may be formed by conventional lithography and etching processes. For example, trenches 22 may be formed through the insulator material 18 (and semiconductor layer 12c) and underlying insulator layer 12b. A timed etch with a selective chemistry, e.g., HF solution, may be performed to recess the insulator layer 12b under the semiconductor layer 12c, thereby forming the cavity 20. The recessing or cavity formation will expose the underside of the semiconductor layer 12c.

Figure 4:
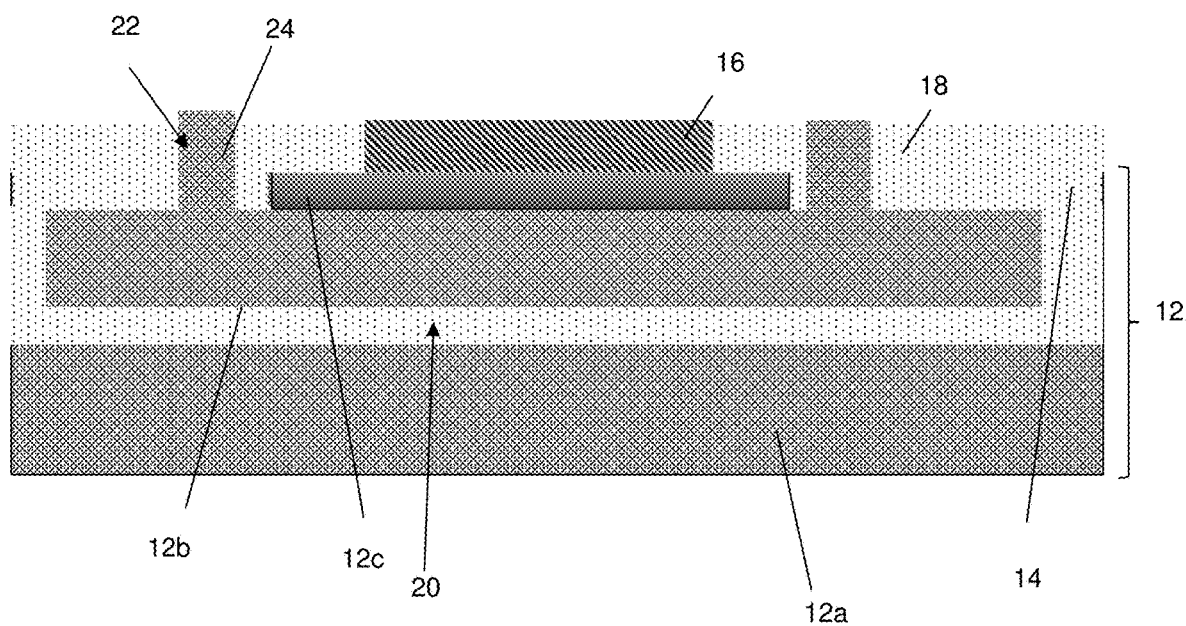
FIG. 4 shows collector material completely filling the cavity and under the partial emitter region, amongst other features, and respective fabrication processes in accordance with aspects of the present disclosure.

As shown in FIG. 4, an epitaxial semiconductor material 24 may be formed in the cavity 20 and trenches 22, vertically below the semiconductor layer 12c and bounded by the insulator layer 12b. In embodiments, the epitaxial semiconductor material 24 may act as a collector region for the bipolar transistor, which is now bounded by the buried insulator layer 12b (e.g., the buried insulator layer 12b is on sidewalls and a bottom surface of the epitaxial semiconductor material 24). Also, the collector region is below the emitter region, e.g., semiconductor material 16, and the base region, e.g., semiconductor layer 12c.

The epitaxial semiconductor material 24 may be formed by a conventional epitaxial growth process, starting from the exposed underside of the semiconductor layer 12c. In embodiments, the semiconductor material 24 may be n-doped Si or SiC material using an in-situ doping process during the epitaxial growth process. The Si or SiC material 24 may comprise a gradient (e.g., graded) concentration of n-type dopant, e.g., arsenic, etc., with a higher percent concentration at a bottom surface of the cavity 20 and a lower percent concentration adjacent to the semiconductor layer 12c.

Figure 5:
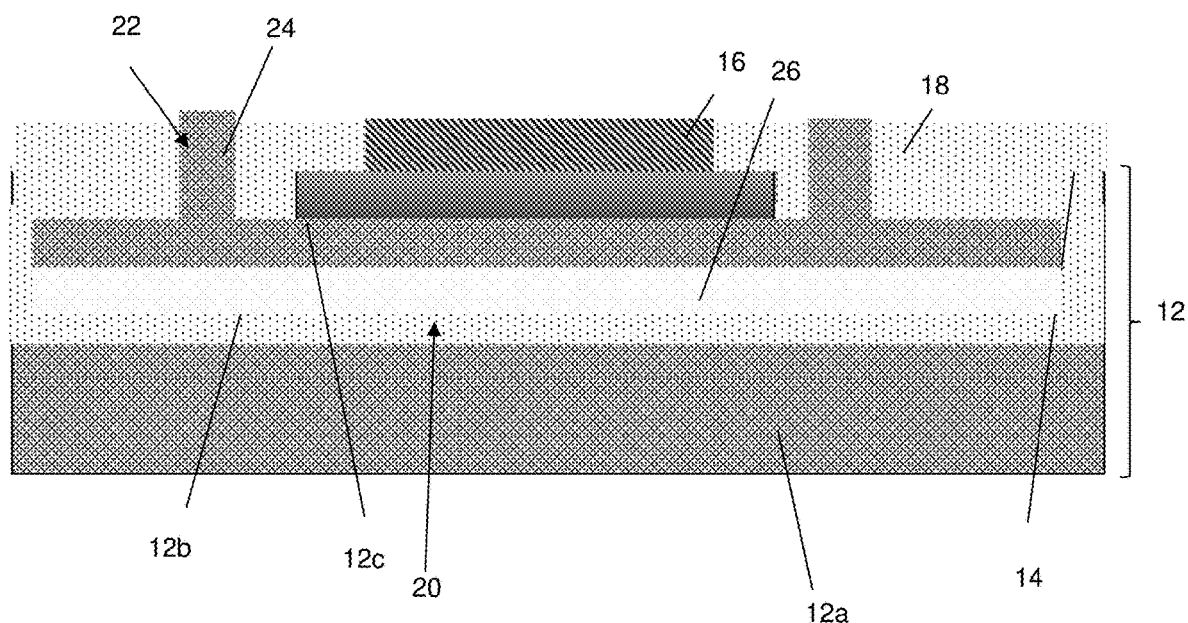
FIG. 5 shows collector material partially filling the cavity, amongst other features, and respective fabrication processes in accordance with aspects of the present disclosure.

FIG. 5 shows an alternative layout in which the cavity 20 is not completely filled with the epitaxial semiconductor material 24. In this way, an airgap 26 will remain below the epitaxial semiconductor material 24, e.g., between the insulator layer 12b and the epitaxial semiconductor material 24.

Also, the buried insulator layer 12b is on sidewalls of the epitaxial semiconductor material 24. Again, the epitaxial semiconductor material 24 may be doped with an n-type dopant, e.g., arsenic or phosphorus, using an in-situ doping process during the epitaxial growth process. As in any of the embodiments, the dopant may be driven in by using a rapid thermal anneal process as is known in the art.

Figure 6A:
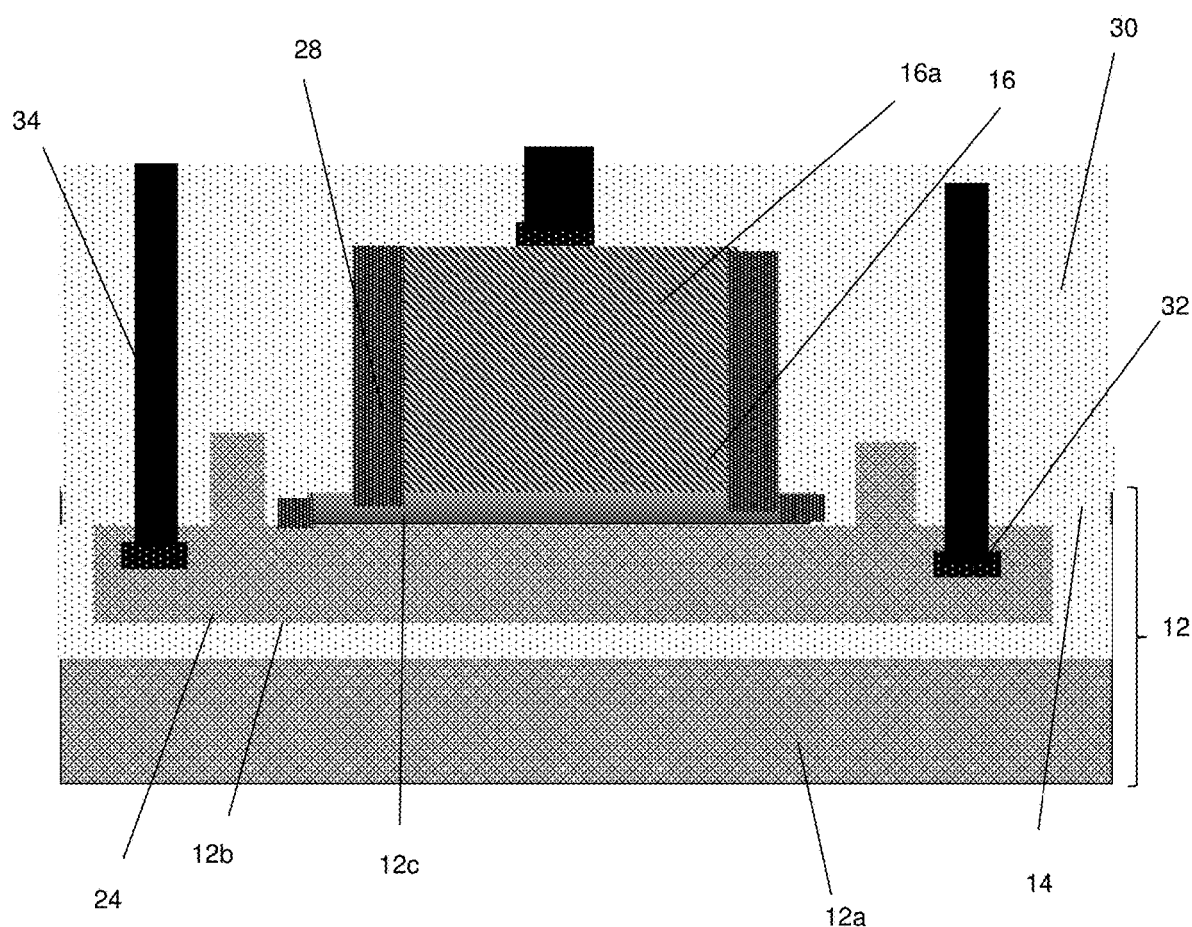
FIG. 6A shows a cross-sectional view of contacts, amongst other features, and respective fabrication processes in accordance with aspects of the present disclosure.
Figure 6B:
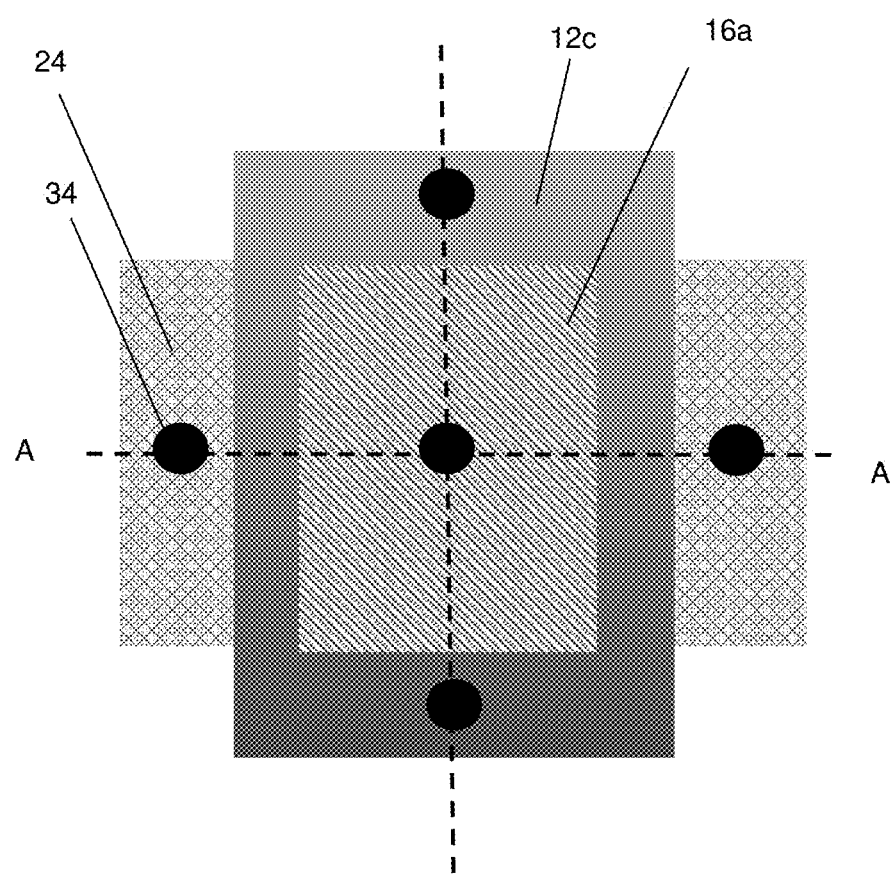
FIG. 6B shows a top down view of the contacts, amongst other features, and respective fabrication processes in accordance with aspects of the present disclosure.

As shown in FIGS. 6A and 6B, the remaining portion of the emitter material 16a may be formed over the emitter material 16. By way of example, the emitter material 16a may be epitaxially grown on the exposed emitter material 16 until a full height is achieved. The emitter material 16a may be formed by an epitaxial growth process with an in-situ doping process of n-type dopants, e.g., arsenic, etc.

Sidewall spacers 28 may be formed on sidewalls of the stack of emitter materials 16, 16a and the semiconductor layer 12c. In embodiments, the sidewall spacers 28 may be an oxide and nitride material, for example, formed by a conventional deposition process, e.g., CVD, followed by an anisotropic etching process to remove the sidewall material from horizontal surfaces, e.g., leaving the sidewall spacers 28 on sidewalls of the stack of emitter materials 16, 16a.

Referring still to FIGS. 6A and 6B, contacts 34 may be formed to the collector region, e.g., semiconductor material 24, extrinsic base region, e.g., semiconductor layer 12c and the emitter region, e.g., stack of materials 16, 16a. More specifically, in FIGS. 6A and 6B, to form the contacts 34, vias are formed in interlevel dielectric material or stack of materials 30 to expose surfaces of the semiconductor materials 16a, 24, 12c. A silicide process may be performed on the exposed semiconductor materials 16a, 24, 12c to form silicide contacts 32. As should be understood by those of skill in the art, the silicide process begins with deposition of a thin transition metal layer, e.g., nickel, cobalt or titanium, over the semiconductor materials 16a, 24, 12c. After deposition of the material, the structure is heated allowing the transition metal to react with exposed silicon (or other semiconductor material as described herein) forming a low-resistance transition metal silicide. Following the reaction, any remaining transition metal is removed by chemical etching, leaving silicide contacts 32.

Conductive material may then be deposited within the vias, over the suicide contacts 32, to form the contacts 34. The conductive material may be tungsten or aluminum, which may also include a barrier liner material. Any excess conductive material on the surface of the interlevel dielectric material or stack of materials 30 may be removed by a conventional CMP process. Also, as further shown in FIG. 6B, the contacts 34 for the emitter region 16a and collector region 24 are on a first axis A-A and the contacts 34 for the base region 12c and collector region 24 are on a second axis B-B, perpendicular to the first axis A-A.

The transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a base region comprising a semiconductor on insulator material;
    an emitter region above the base region and surrounded by an insulator material above the semiconductor on insulator material; and
    a collector region of semiconductor material under the base region and within a cavity of a buried insulator layer,
    wherein a bottom surface of the collector region is facing a portion of the buried insulator layer below the collector region and portions of the collector region extend upward into the insulator material and above a bottom surface of the emitter region.

2. The structure of claim 1, wherein the base region comprises SiGe material.

3. The structure of claim 1, wherein the emitter region comprises epitaxial semiconductor material on the base region.

4. The structure of claim 1, wherein the collector region comprises epitaxial semiconductor material.

5. The structure of claim 4, wherein the epitaxial semiconductor material comprises Si base material with an n-type dopant.

6. The structure of claim 5, wherein the n-type dopant comprises a higher concentration at a bottom than at a top.

7. The structure of claim 4, wherein the epitaxial semiconductor material completely fills the cavity and contacts an underside of the base region.

8. The structure of claim 4, wherein the epitaxial semiconductor material partially fills the cavity and contacts an underside of the base region.

9. The structure of claim 8, further comprising an airgap under the epitaxial semiconductor material.

10. The structure of claim 4, wherein the buried insulator layer comprises a buried oxide layer under the semiconductor on insulator material, and the epitaxial semiconductor material of the collector region is surrounded by the buried oxide layer.

11. The structure of claim 1, further comprising contacts to the emitter region, the base region and the collector region, and from a top down view the contacts to the emitter region and the base region are on a first axis perpendicular to the contacts to the collector region and emitter region on a second axis.

12. A structure comprising:
a semiconductor on insulator substrate comprising a semiconductor handle substrate, a buried insulator material above the semiconductor handle substrate and a semiconductor layer above the buried insulator material;
a base region comprising the semiconductor layer and bounded by shallow trench isolation structures;
an emitter region vertically above the base region and bounded by an insulator material above the buried insulator material; and
a collector region of semiconductor material vertically below the base region and surrounded from above, below and sides by the buried insulator material and further extending into the insulation material on sides- of the base region and above a bottom surface the emitter region.

13. The structure of claim 12, wherein the collector region comprises a doped semiconductor material within a cavity of the buried insulator material.

14. The structure of claim 12, wherein the collector region comprises a doped semiconductor material partially filling a cavity of the buried insulator material.

15. The structure of claim 14, further comprising an airgap under the doped semiconductor material.

16. The structure of claim 12, wherein the buried insulator material is on sidewalls of the collector region.

17. The structure of claim 12, wherein the collector region, the base region and the emitter region are vertically stacked.

18. The structure of claim 12, wherein the semiconductor layer of the base region comprises SiGe.

19. The structure of claim 12, wherein the semiconductor layer of the base region contacts a semiconductor material of the collector region.

20. A method comprising:
forming a base region comprising a semiconductor on insulator material;
forming an emitter region above the base region and surrounded by an insulator material above the semiconductor on insulator material; and
forming a collector region of semiconductor material under the base region and within a cavity of a buried insulator layer, wherein a bottom surface of the collector region is facing a portion of the buried insulator layer below the collector region and portions of the collector region extend upward into the insulator material and above a bottom surface of the emitter region.

* * * * *